(12) United States Patent
Chen

(10) Patent No.: US 8,134,206 B2
(45) Date of Patent: Mar. 13, 2012

(54) SEMICONDUCTOR DEVICE

(75) Inventor: Xingbi Chen, Chengdu (CN)

(73) Assignee: University of Electronic Science and Technology, Chengdu (CN)

( * ) Notice: Subject to any disclaimer, the term of this patent is extended or adjusted under 35 U.S.C. 154(b) by 237 days.

(21) Appl. No.: 12/684,181

(22) Filed: Jan. 8, 2010

(65) Prior Publication Data

US 2010/0171193 A1      Jul. 8, 2010

(30) Foreign Application Priority Data

Jan. 8, 2009  (CN) .......................... 2009 1 0000724

(51) Int. Cl.
*H01L 29/94*      (2006.01)

(52) U.S. Cl. ........ 257/342; 257/213; 257/288; 257/327; 257/335; 257/341

(58) Field of Classification Search .................. 257/342, 257/213, 288, 327, 335, 341
See application file for complete search history.

(56) References Cited

U.S. PATENT DOCUMENTS

| | | | | |
|---|---|---|---|---|
| 5,097,314 | A * | 3/1992 | Nakagawa et al. ........... | 257/500 |
| 6,245,609 | B1 * | 6/2001 | Tsai et al. ..................... | 438/234 |
| 6,310,365 | B1 | 10/2001 | Chen | |
| 6,998,681 | B2 | 2/2006 | Chen | |
| 2008/0073745 | A1 * | 3/2008 | Tang et al. .................... | 257/500 |
| 2010/0171193 | A1 * | 7/2010 | Chen ............................. | 257/501 |
| 2010/0244089 | A1 * | 9/2010 | Chen ............................. | 257/111 |
| 2011/0121808 | A1 * | 5/2011 | Girdhar et al. ................ | 323/311 |

OTHER PUBLICATIONS

BCD Technology for Smart Power ICs, 1.2.1, Isolation Techniques, pp. 3-5.
X.B. Chen et al., Lateral High-Voltage Devices using an Optimized Variational Lateral Doping, Int. J. Electronics, 1996, vol. 80, No. 3, pp. 449-459, http://www.paper.edu.cn.
X.B. Chen et al., Theory of Optimun Design of Reversed-Biased Junctions Using Resistive Field Plates and Variation Lateral Doping, Solid State Electronics, vol. 35, No. 9, pp. 1365-1370, 1992, http://www.paper.edu.cn.

* cited by examiner

*Primary Examiner* — Michael Shingleton
(74) *Attorney, Agent, or Firm* — McGarry Bair PC

(57) ABSTRACT

This invention provides a semiconductor device, which is used to manufacture two lateral high-voltage devices on the same substrate, where the voltages between maximum voltage terminals and minimum voltage terminals of the two devices have not too much difference. Both devices are formed on two different surface regions with a small isolation region in-between the two regions. When the semiconductor region(s) of the isolation region is fully depleted, its effective electric flux density emitted to the substrate is of a value between the values of its adjacent regions of said two semiconductor devices. The figure presented here schematically shows the structure used to form a low-side high-voltage n-MOST and high-voltage n-MOST and $M_1$, where their terminal voltages are very close.

5 Claims, 5 Drawing Sheets

SEMICONDUCTOR DEVICE

CROSS-REFERENCE TO RELATED APPLICATIONS

This application is a claims priority on Chinese Application No. CN200910000724.5, filed Jan. 8, 2009.

FIELD OF THE INVENTION

The present invention relates to an integration technique for High-Voltage Integrated Circuits (HVICs) and Power Integrated Circuits (PICs). More specifically, the present invention relates to a semiconductor device.

BACKGROUND OF THE INVENTION

The conventional techniques for manufacturing high-voltage or power devices in HVICs or PICs are Dielectric Isolation (DI), p-n Junction Isolation (JI) and Self Isolation (SI). Among these three techniques, the isolation performance of DI is the best, and the isolation performance of the JI is better than that of SI, whereas the cost of SI is the lowest, and the cost of DI is the highest. The technique of reduced surface field (RESURF) is often used in SI, and the breakdown voltage by using such method is normally only 70% of that of a parallel plane junction made by the same substrate. Furthermore, the specific on-resistance $R_{on}$ of the devices by using the technique of RESURF is high. For references of those techniques one can see Ref [1].

As shown in FIG. 1, a conventional HVIC, 100, includes four portions: a low-voltage control circuit 101, a low-side driver 102, a high-voltage level shifter 103, and a high-side driver 104. It can be seen that the low-side driver 102 is connected to the input terminal of low-side n-type Metal-Oxide-Semiconductor Transistor (n-MOST) 105, and the high-side driver 104, is connected to the input terminal of a high-side n-MOST 106. Here, a common terminal of the high-side driver 104 is connected with an output terminal of a totem pole connection point of two devices. The connection point of these two devices is called TUB, whose voltage with regard to the ground can vary from the voltage of the ground, i.e. zero up to that of a high bus-voltage. That is to say, the TUB has a floating voltage terminal. Both of the low-side driver 102 and the low-voltage control circuit 101 are low-voltage circuits, and the power supply for them uses the ground as a reference, whereas the high-side driver 104 is a low-voltage circuit using the voltage of the floating terminal of the TUB as a reference. The output terminal of the low-voltage control circuit, 101, is used as the input terminal of the high-voltage level shifter 103 in FIG. 1. The output terminal of the high-voltage level shifter 103 is used as the input terminal of the high-side driver, 104, with a voltage varying from that of ground up to the highest voltage, therefore, the high-voltage level shifter 103 must have high voltage devices therein.

In Ref [2-4], the present inventor proposes some techniques to implement high-side and low-side devices which can bear high voltage by taking advantage of optimum variation lateral doping. The techniques are CMOS and/or BiCMOS technology-compatible without using DI and JI techniques for manufacturing devices, so that high-side and low-side devices as well as a low-voltage high-side driver using the TUB as a common terminal can be realized on a single chip with lower cost.

However, in the conventional layout design, the high-voltage high-side and low-side devices as well as the two high-voltage devices in the high-voltage level shifter are implemented separately in one chip, and each of them has its own voltage-sustaining region. It is well known that the higher the sustaining voltage is, the wider the voltage-sustaining region is, and thus each high-voltage device needs a larger area for transmitting signals, whereas the current for transmitting signals in the two high-voltage devices in high-voltage level shifter is small. Thus, even the edge terminations of the two devices are round ones, the two devices still need a large area of a chip, because the radii of the device are longer than the length of the voltage-sustaining region.

In addition, if the two devices are individually made in different regions, the interconnection between the high-voltage terminals with regard to the substrate of them must have their own pads, and outer connections is indispensable, which leads increasing of the area of a chip and make the technology more complicated.

REFERENCES

[1] B. Murari, et al., <Smart Power IC's Technologies and Application>, Spring-Verlag, Berlin, Heidelberg, N.Y., 1995
[2] X. B. Chen, U.S. Pat. No. 6,998,681 B2, or Chinese patent ZL 200310101268.6.
[3] X. B. Chen, et al., "Theory of optimum design of reverse-biased p-n junctions using resistive field plate and variation lateral doping", Solid-State Electronics, Vol. 35, No. 9, pp. 1365-1370 (1992).
[4] X. B. Chen, et al., "Lateral high-voltage devices using an optimized variation lateral doping", Int. J. Electronics, Vol. 80, No. 3, pp. 449-459 (1996).
[5] X. B. Chen, U.S. Pat. No. 6,310,365B1, or Chinese patent ZL 98116187.1.

DESCRIPTION OF THE PREFERRED EMBODIMENTS

In this section, the present invention will be described and illustrated in detail with reference to the drawings, wherein the illustrative embodiments of the present invention will be demonstrated. In all of the following figures, the same reference number represents the same or similar component or element.

Figure 2:
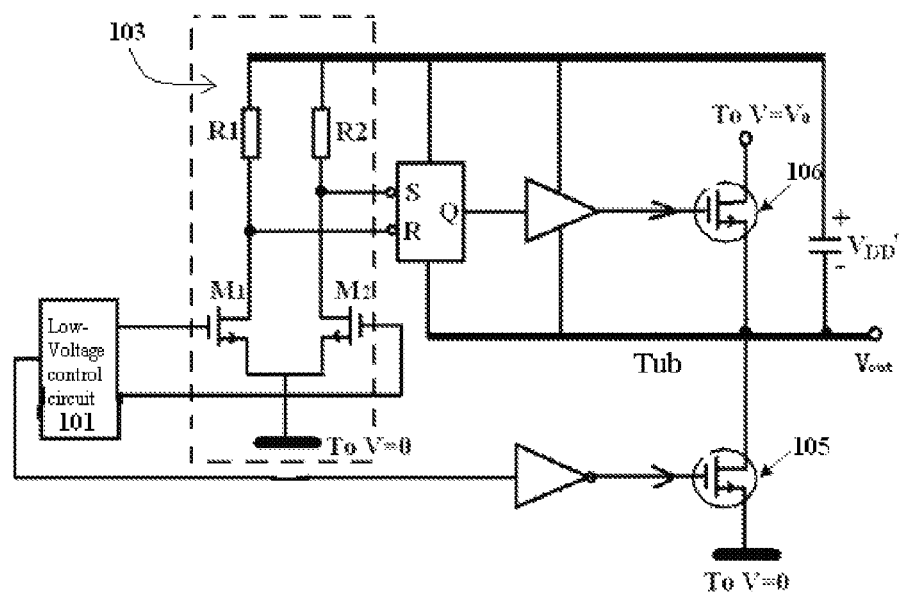
FIG. 2 shows a specific circuit diagram including a high-voltage level shifter.

FIG. 2 shows a specific circuit for illustrating the variation of the highest terminal voltage of the high-voltage level shifter 103. In FIG. 2, there are a low-voltage control circuit 101, a high-voltage level shifter 103, a high-side n-MOST 106, and a low-side n-MOST 105. In 103, devices M1 and M2 are high-voltage n-MOST. M1 and M2 transmit signals to turn on and turn off the high-side n-MOST respectively. Once M1 is turned on, a current flows through R1, a low voltage approximately equal to $V_{out}$, the voltage of the output terminal of the totem pole structure, is then generated on one of the input terminals of RS trigger, which turns the high-side n-MOST 106 on via the high-side driver. Similarly, the high-side n-MOST 106 is turned off via M2. When M1 and M2 are both off, the drain voltages are both $V_{out}+V_{DD}$, $V_{DD}$ being the voltage of power supply for the high-side driver. The value of $V_{out}$ is related to the on or off status of high-side and low-side devices. In the ideal situation, when the high-side n-MOST 106 is turned on and the low-side n-MOST 105 is turned off, $V_{out}$ equals to $V_0$ and its value is much larger than that of $V_{DD}$. On the contrary, when the low-side n-MOST 105 is turned on and the high-side n-MOST 106 is turned off, the value of $V_{out}$ is close to zero. Therefore the drain voltages of M1 and M2 vary with the drain voltage ($V_{out}$) of the low-side n-MOST 105 and the maximum difference between them is $V_{DD}$, which is much smaller than $V_0$.

By the way, in practical operations, the value of $V_0$ may vary instead of keeping constant. However, the maximum value thereof can not exceed the breakdown voltage of high-voltage device.

Figure 3:
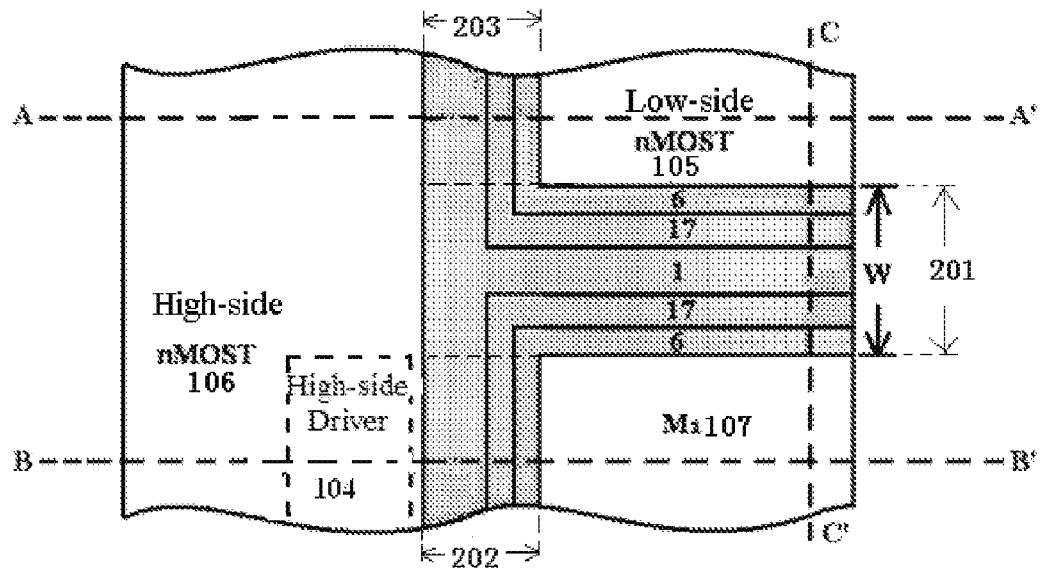
FIG. 3 shows a top view of the surface voltage-sustaining regions of three devices: a device $M_1$ used for high-voltage level shifter, a high-side n MOST and a low-side n MOST made by using the present invention, and the isolation regions among the three devices.
Figure 6:
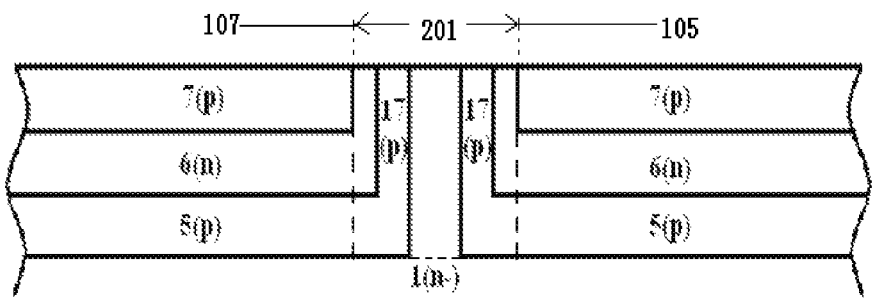
FIG. 6 shows a schematic cross-sectional view of the isolation region and voltage-sustaining regions of a low-side n-MOST and M1, along the dash-line CC' in FIG. 3.
Figure 7:
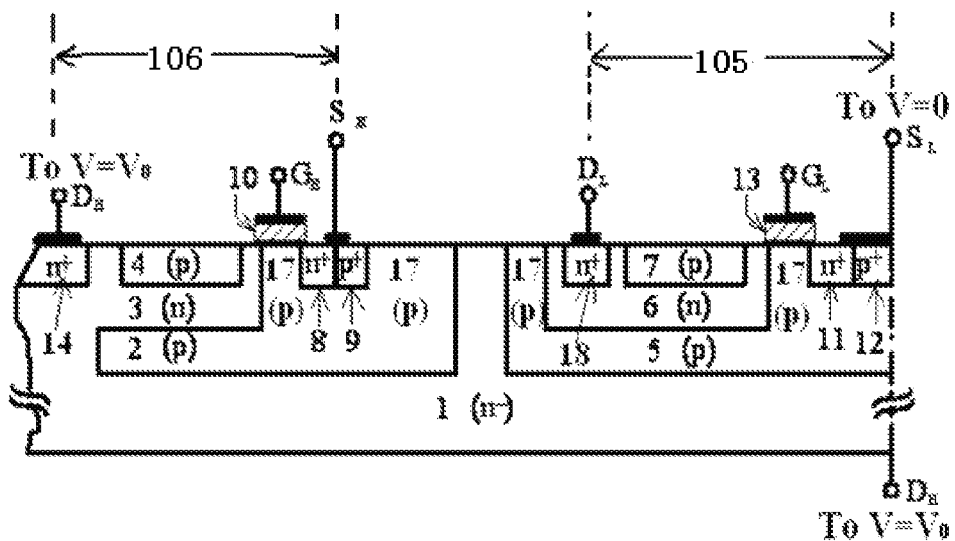
FIG. 7 shows schematically a procedure of manufacturing a cross-sectional view of a high-side n-MOST and a low-side n-MOST by using the basic voltage-sustaining structure of Ref. [2].
Figure 8:
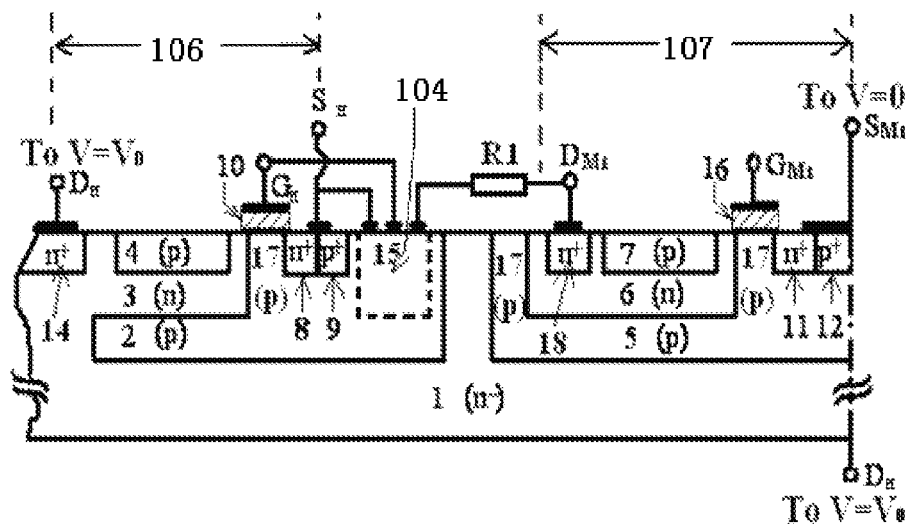
FIG. 8 shows schematically a procedure of manufacturing a high-voltage level shifter and integrating a high-side n-MOST and a low-voltage high-side driver inside the TUB 15 by using the voltage-sustaining structure in FIG. 7.

FIG. 3 shows schematically a top view of the voltage-sustaining regions of three devices, including the device M1 used for the high-voltage level shifter and the high-side n-MOST, as well as the low-side n-MOST implemented by using the present invention and the isolation region among them. It can be seen from FIG. 3 that the high-side n-MOST 106 is located in the left region, and low-side n-MOST 105 is located in the upper right region, whereas the high-voltage M1 107 is located in the lower right region and a high-side driver 104 is in a block enclosed by dashed lines in the left region. There is an isolation region 202 between the high-side n-MOST 106 and device M1 107. There is an isolation region 203 between the low-side n-MOST 105 and the high-side n-MOST 106. The isolation region 201 between device M1 107 and the low-side n-MOST 105 includes regions 1, 17 and 6. The cross-section views perpendicular to the paper along the dotted line AA', along the dotted line BB' and along the dotted line CC' in FIG. 3 are shown in FIGS. 7, 8, and 6 respectively.

Figure 4:
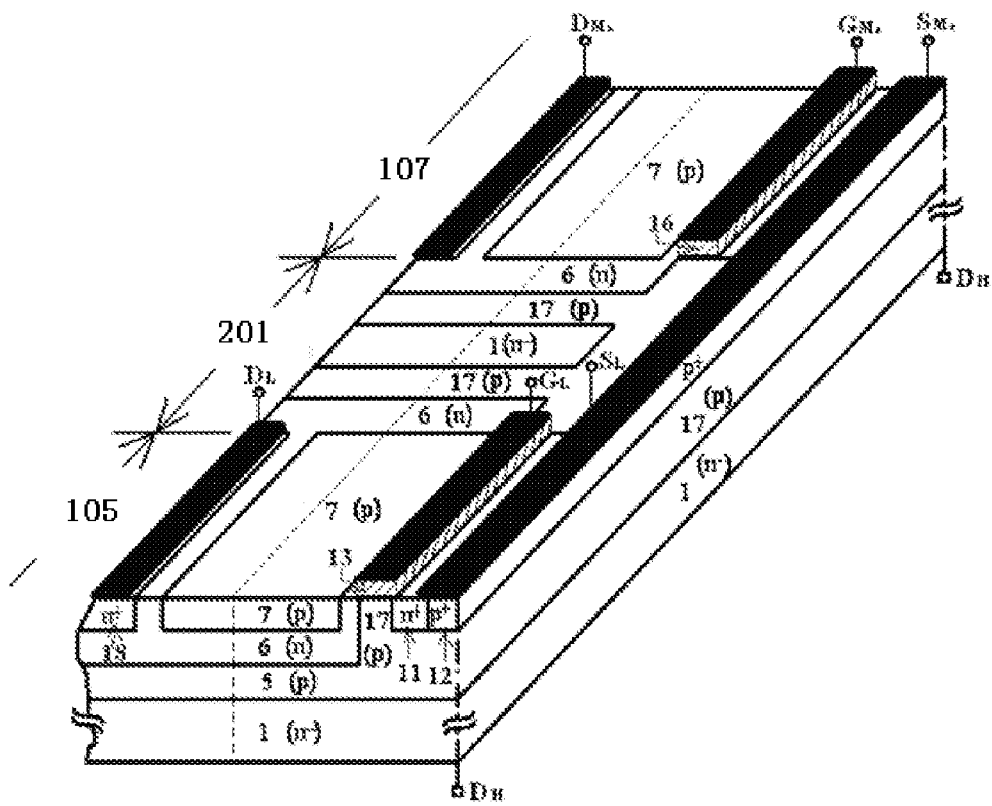
FIG. 4 shows a solid figure viewed from top but not vertically of a low-side n-MOST and $M_1$, whose terminal voltages have not too much difference being implemented in the neighboring surface regions by using the present invention.

FIG. 4 shows a solid figure viewed from top but not vertically of a low-side n-MOST and the high voltage device M1 in the high voltage level shifter, being implemented in the neighboring surface regions by using the present invention. In the low-side n-MOST 105, $D_L$ stands for the drain electrode, $S_L$ stands for the source electrode and $G_L$ stands for the gate electrode. The shaded area in FIG. 4 stands for the gate oxide or gate insulator layer. $S_L$ is connected both to n⁺-source region 11 and source-body p-region 17 through p⁺-region 12. The structure of 107 is the same as 105, where $D_{M1}$ is the drain electrode of $M_1$, $S_{M1}$ is the source electrode and $G_{M1}$ is the gate electrode. $S_{M1}$ is connected both to the n⁺-source region 11 and source-body p-region 17 through p⁺-region 12. $D_L$ of the low-side n-MOST 105 is connected to the source electrode $S_H$ of the high-side n-MOST as the output terminal $V_{out}$ of the totem pole. $G_L$ is connected to the output terminal of the low-side driver; $S_L$ is connected to $S_{M1}$ and the voltage of them is taken as zero. $G_{M1}$ stands for an output terminal of the low-voltage control circuit 101, capable transferring a signal for turning on the high-side device. $D_{M1}$ is connected to the resistor R1 in FIG. 2 which is also connected to the input terminal of a low-voltage high-side driver set in the TUB 15. The n⁻-substrate 1 with the potential $V_o$ is connected to $D_H$ through an outer connection (refer to FIG. 2).

Figure 5:
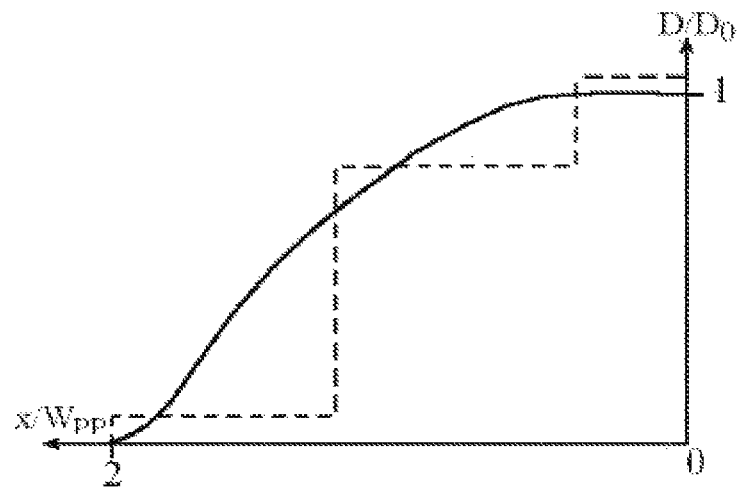
FIG. 5 shows a schematic diagram of the surface density of donor versus the surface distance when the surface dimension of surface voltage-sustaining region is $L(=2W_{pp})$ and a breakdown voltage of 95% of $V_{Bpp}$, where x stands for the distance along the drain direction from the source substrate region, $W_{pp}$ being the depletion width of the substrate in a one-sided abrupt parallel plane junction $n^+$-$p^-$ formed by the same $p^-$-substrate.

FIG. 5 schematically shows that in a surface voltage-sustaining region of nearly ideal case according to Ref [3] and [4], the surface density of donor, D, versus the surface distance x from the region of maximum voltage with respect to a p-type substrate, where the total surface distance of surface voltage-sustaining region is L(=2$W_{pp}$) and the breakdown voltage is of 95% of $V_{Bpp}$, where $V_{Bpp}$, $W_{pp}$ and $D_0$ are the breakdown voltage, depletion width of the substrate and the depleted charge density of n⁺ region in a one-sided abrupt parallel plane junction n⁺-p⁻ formed by the same p⁻-substrate. Note that for the structure shown in FIG. 4, the substrate is n⁻-region 1, so, the electric flux density qD should be produced by a net density of ionized acceptor D, where $D_0=qN_DW_{pp}$, q is the electron charge and $N_D$ is the doping concentration of substrate n⁻-region 1. D is the result of ionized impurity density of p-region 5 plus that of p-region 7 minus that of n-region 6, and the dashed line in FIG. 5 represents three uniform surface charges to replace the solid curve and can be used to achieve a breakdown voltage very close to $V_{Bpp}$.

In the HVIC, an isolation region must be set between the low-side n-MOST device 105 and device M1 107 in FIG. 4 to assure that their own currents flow in their own regions. FIG. 6 is a schematic cross-sectional view of the isolation region 201 and the voltage-sustaining regions of the low-side n-MOST 105 and M1 107 along the dashed line CC' in FIG. 3 or along the block enclosed by the dashed lines in FIG. 4 under the same value of the x-ordinate, i.e., under a certain distances from the edge of source-body region to drain region. The isolation region 201 consists of p-region 17, n-region 6 and a part of the n⁻-substrate 1.

In order to sustain the surface voltage of a certain value, it is required that the surface effective ionized impurity density should meet the demand as FIG. 5 shown for any place of different value of x, no matter the place is in the low-side n-MOST device 105, or in the region 107, or even in the region 201 shown in FIG. 4. However, it should be noted that a small deviations is allowed. The average electric flux density of net acceptors in the width W of the isolation region 201 in FIG. 6 should be between that in the voltage-sustaining regions of the low-side n-MOST 105 and M1 107. That is to say, in the isolation region 201 with the width of W, the average net density of ionized acceptor as defined by the sum of the acceptor densities in the p-region 17 and p-region 5 minus the ionized donor density in the n-region 6 in both sides and the portion of n⁻-region 1 within the isolation region, must be between the values of the effective ionized acceptor density of the voltage-sustaining region of its both adjacent regions.

FIG. 7 is a schematic cross-sectional view of the high-side n-MOST and the low-side n-MOST by using the basic voltage-sustaining structure of Ref [2]. In the high-side n-MOST 106, $D_H$, $S_H$ and $G_H$ stand for the electrodes of drain, of source and of gate of the high-side n-MOST, respectively. The shaded area 10 stands for the gate oxide or gate insulator. $D_H$ is connected to n⁺-drain region 14, and $S_H$ is connected both to n⁺-source region 8 and source-body 17 through p⁺-region 9. $D_H$ is connected to $V_0$, and $S_H$ is connected to $D_L$, which is the output terminal $V_{out}$ of the totem pole. The first surface voltage-sustaining region is constructed by p-region 5, p-region 7 and n-region 6, the second surface voltage-sustaining region is constructed by p-region 4, n-region 3 and p-region 2.

Since the isolation between the first and the second surface voltage-sustaining regions has been illustrated in Ref [2], [4] and [5], it is not repeated in the present invention.

FIG. 8 shows the high-side n-MOST 106 and the low-voltage high-side driver in the TUB 15 formed on the same substrate by using the voltage-sustaining structure of the high-side and low-side devices in FIG. 7. In this figure, the first and the second voltage-sustaining regions as well as the structure of isolation region between them are the same with those shown in FIG. 7.

Figure 1:
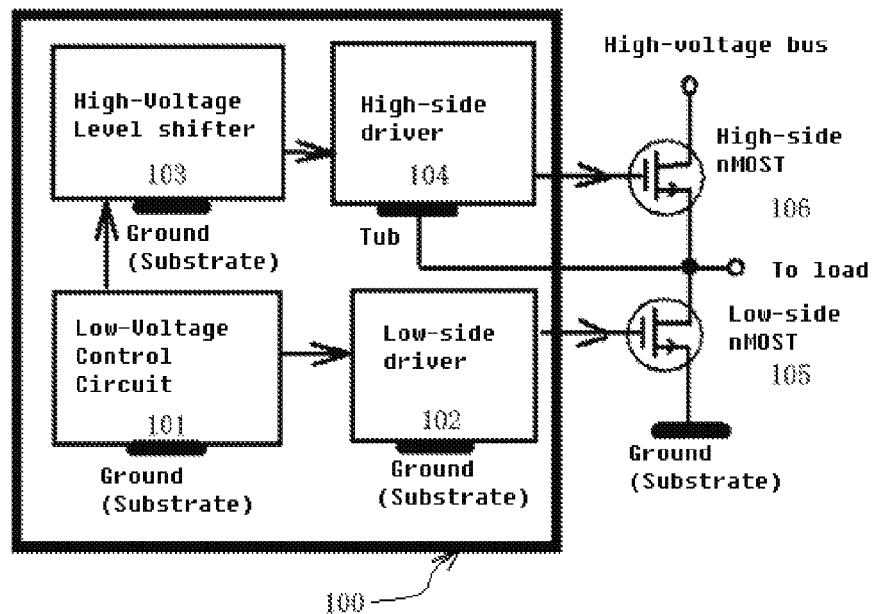
FIG. 1 shows schematically a block figure of four parts in a conventional high voltage (power) integrated circuit.

Note that in FIG. 8, there is a region 15 shown as a block enclosed the dotted lines in source-body region 17 of the high-side n-MOST 106. The region 15 is set for low-voltage IC as that of 104 in FIG. 1. In this region, there may be an n-well(s) and a p-well(s), the details of which are not shown in this figure, and there is a connection to R1, and another terminal of R1 is connected to $D_{M1}$. There is also a terminal connected to the TUB, as well as to $S_H$. Besides, there is still another terminal connected to the $G_H$.

By the way, the voltage drop across the resistor R1 is very small and it can be replaced by an active resistor instead of a passive one, such as a low-voltage n-MOST or p-type Metal-Oxide-Semiconductor Transistor (p-MOST) whose drain electrode is connected to its gate electrode. It can be set in the region 15 and the R1 shown in FIG. 8 then become a connection line.

Figure 9:
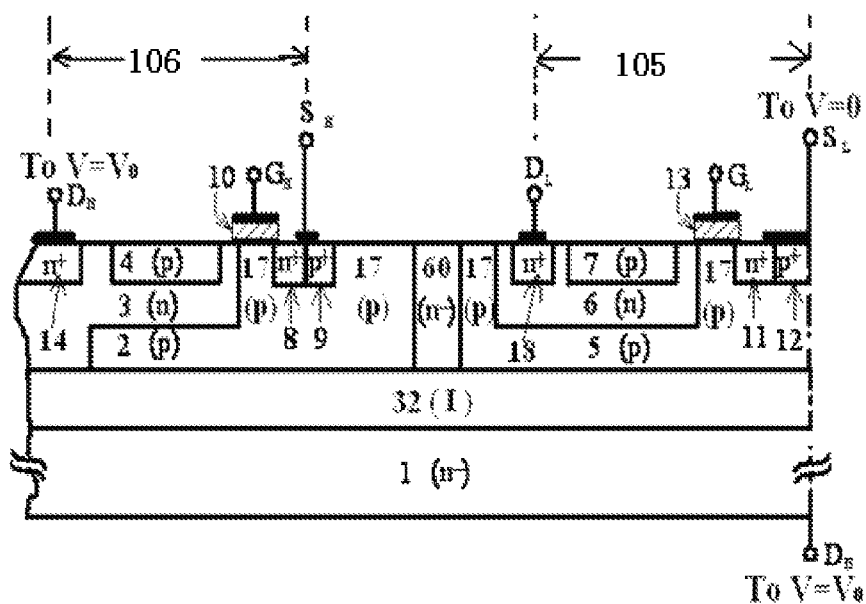
FIG. 9 shows an insulator layer located between the n⁻-substrate 1 and two p-regions 2 and 5.

Naturally, the present invention can be used in such a situation that there is an insulator layer between the surface voltage-sustaining region and the substrate. FIG. 9 shows such a case that there is an insulator layer 132 to isolate the surface voltage-sustaining region from the substrate, and n⁻-region 60 separates the first voltage-sustaining region from the second one. The bottom of n⁻-substrate is connected to $D_H$ through an outer connection.

Figure 10:
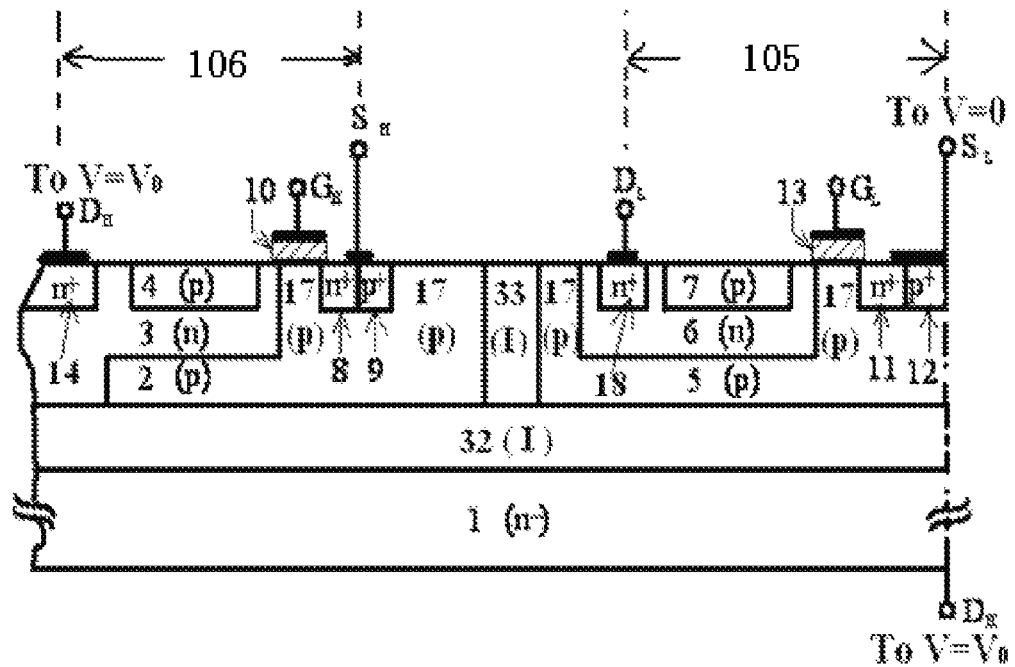
FIG. 10 shows an insulator layer located between the two voltage-sustaining regions.

Naturally, the present invention can further be used in a situation that there is an insulator region to isolate the first surface voltage-sustaining region from the second one. FIG. 10 shows such a case. In this figure, there is an insulator layer I-region 33. Not to mention, insulator layers can also be set between each adjacent n-region and p-region in a voltage-sustaining region. The insulator layers may comprise common materials used in semiconductor device fabrication including, but not limited to silicon dioxide, silicon nitride, tetraethylorthosilicate (TEOS) glass, or combinations thereof. These materials may be deposited by known methods including, but not limited to physical vapor deposition (PVD), chemical vapor deposition (CVD), plasma enhanced chemical vapor deposition (PECVD), atomic layer deposition (ALD), or combinations thereof.

Figure 11:
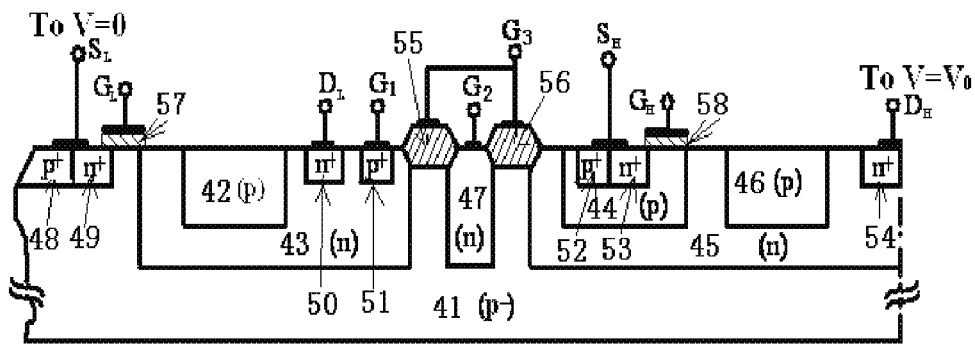
FIG. 11 shows schematically a procedure of manufacturing a high-side n-MOST and a low-side n-MOST by using the basic voltage-sustaining structure of Ref [5].

The present invention can not only be used for the structure of voltage-sustaining region set as Ref [3, 4] as described above, but also be used for the basic voltage-sustaining structure stated in Ref [5]. FIG. 11 is a schematic diagram about the high-side n-MOST and low-side n-MOST by using the basic voltage-sustaining structure of Ref [5]. In the low-side n-MOST, $D_L$, $S_L$ and $G_L$ stand for the electrodes of source, drain and gate, respectively. The shaded area 57 stands for the gate oxide or gate insulator. $D_L$ is connected to n⁺-drain region 50, and $S_L$ is connected both to n⁺-source region 49 and source-body 41 through p⁺-region 48. In the high-side n-MOST 106, $D_H$, $S_H$ and $G_H$ stand for the electrodes of source, drain and gate, respectively. The shaded area 58 stands for the gate oxide or gate insulator. $D_H$ is connected to n⁺-drain region 54, and $S_H$ is connected both to n⁺-source region 53 and source-body 44 through p⁺-region 52. In this figure, the first surface voltage-sustaining region is the one in the low-side n-MOST, which includes p-region 42 and n-region 43; the second surface voltage-sustaining is the one in the high-side n-MOST, which includes p-region 46 and n-region 45. The flux density of net ionized donor of the two voltage-sustaining regions must meet the requirement as the curve shown in FIG. 5.

In FIG. 11, the isolation region of the low-side and high-side n-MOST is realized by using a p-n junction. The low-side n-MOST in this figure has a p⁺-region 51 near n⁺-region 50, where 51 is connected to an electrode $G_1$. In the isolation region, an n-region 47 is set in a portion of the substrate 41 in-between the first voltage-sustaining region and the second voltage-sustaining region. The region 47 has an electrode $G_2$ on its top. Since the voltage applied to $G_1$ is 0.7V lower than that applied to $D_L$, so when G1 is connected to G2, region 47 and region 41 is reverse-biased and an electron barrier is formed between them. The barrier formed can avoid the current flowing from the first voltage-sustaining region to the second one. The shaded areas 55 and 56 are gate oxides or gate insulators with an electrode $G_3$. This electrode can be connected both to source electrode $S_H$ of the high-side n-MOST and drain electrode $D_L$ of the low-side n-MOST to reduce the voltage drop across the two voltage-sustaining regions. Thus, a better isolation can be achieved.

Figure 12:
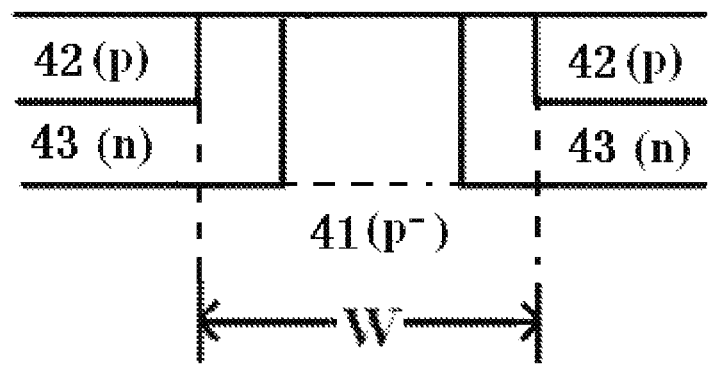
FIG. 12 shows a cross-sectional view of the first voltage-sustaining regions in FIG. 11 and the isolation region among them in the direction perpendicular to the paper at a certain point.

To show the present invention can also be used for isolation between two high-voltage devices with surface voltage-sustaining regions shown in FIG. 11, an example is taken for isolation between a low-side high-voltage device and high-voltage level shifter in FIG. 12. This figure shows a cross-sectional view of the isolation region in the direction perpendicular to the paper at a point in FIG. 11. In FIG. 12, the average electric flux density of net ionized donor in a width of W, which is produced by the sum of ionized density of n-region 43 in both sides minus the ionized density of 41 in the portion enclosed by dash-lines, must meet the requirement as the curve shown at the certain point in FIG. 5.

Although the impurity profile in the above mentioned voltage-sustaining region is set as Ref [3], it is evident that the method of isolation of the present invention can be used in such cases as: the technique of RESURF with a uniform impurity profile, the technique of JTE with the two-section impurity profiles with different values and other voltage-sustaining regions with other kinds of impurity profile.

Although all of the above mentioned examples illustrate the technique of integrating the power devices in a totem pole and devices of the high-voltage level shifter together, it is obvious that this technique can be used for the isolation of two high-voltage devices with terminal voltages having not too much difference.

Some examples of the present invention have been illustrated above. Obviously, many application examples can be made by those skilled in the art under the spirit of the present invention without going beyond the scope defined by the claims of the present invention.

Although the description of the present invention is given for illustration and description, it is not intended to be exclusive or to limit the present invention to the disclosed form. Many modification and changes are obvious to those skilled in the art. The embodiments are chosen and described to better explain the principle and the actual use of the present invention and enable those skilled in the art to understand the present invention so as to design embodiments with various modifications suitable for particular uses.

The invention claimed is:

1. A semiconductor device comprising at least a surface isolation region between two surface high-voltage devices implemented on the surface of a lightly doped substrate of a first conductivity type, the potential of a neutral region of said substrate under an externally applied reverse biasing voltage being taken as reference, each of said surface devices consisting of at least a surface region of semiconductor of a second conductivity type having the largest voltage and another surface region of semiconductor of the first conductivity type having the smallest voltage, wherein a surface region between said region having the largest voltage and said region having the smallest voltage is a surface voltage-sustaining region, where the bottom of said voltage-sustaining region is a semiconductor region of said second conductivity type;

each said surface voltage-sustaining region of both surface high-voltage devices is fully depleted under a maximum reverse voltage applied to said largest voltage region and smallest voltage region and said surface high-voltage device then emits an effective electric flux density of second conductivity type to said substrate;

said surface voltage-sustaining region has a thickness, said thickness being smaller than the depletion thickness of a one-sided abrupt parallel plane junction made by said substrate under its breakdown voltage;

wherein the potential difference between both largest voltage regions of said two devices and the potential difference between both smallest voltage regions of said two devices are much smaller than said maximum reverse voltages applied to said largest voltage region and smallest voltage region of both devices;

said two surface high-voltage devices are implemented separately in two surface areas, and a surface isolation region is between said two areas, wherein the directions from said largest voltage region to smallest voltage region of both devices and of said surface isolation region are identical;

said isolation region has two widths perpendicular to each other and perpendicular to said direction, said widths being smaller than the depletion width of a one-sided abrupt parallel plane junction made by said substrate under its breakdown voltage;

said isolation region has at least two semiconductor layers of second conductivity type, one being contacted to one of said surface devices and another being contacted to another of said surface devices, wherein when the semiconductor region(s) of the isolation region is fully depleted, its effective flux density of second conductivity type emitted to the substrate is of a value between the values of its adjacent surface voltage-sustaining regions of said two surface semiconductor devices; said effective electric flux density of said second conductivity type is produced by the amount of ionized impurities in a surface area divided by the area;

said largest voltage is positive when said first conductivity type is a p-type, or negative when said first conductivity type is n-type.

2. A semiconductor device according to claim 1, wherein when said largest voltage is applied across said largest voltage region and said smallest voltage region, said effective flux density of second conductivity type emitted to said substrate decreases gradually towards said smallest voltage region according to the increasing of the distance from said largest voltage region.

3. A surface isolation region according to claim 1, wherein an insulator region is inside said isolation region.

4. A semiconductor device according to claim 1, wherein an insulator layer is set in-between said substrate and said high-voltage surface devices as well as said surface isolation region.

5. A semiconductor device according to claim 1, wherein said voltage-sustaining regions consist of semiconductor layers with different conductivity types.

* * * * *